(12) United States Patent
Nishizawa et al.

(10) Patent No.: US 7,569,925 B2
(45) Date of Patent: Aug. 4, 2009

(54) MODULE WITH BUILT-IN COMPONENT

(75) Inventors: Yoshihiko Nishizawa, Yasu (JP); Norio Sakai, Moriyama (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 11/462,395

(22) Filed: Aug. 4, 2006

(65) Prior Publication Data

US 2006/0284300 A1  Dec. 21, 2006

Related U.S. Application Data

(63) Continuation of application No. PCT/JP2005/000052, filed on Jan. 6, 2005.

(30) Foreign Application Priority Data

Feb. 9, 2004 (JP) .............................. 2004-031595

(51) Int. Cl.
*H01L 23/053* (2006.01)
*H01L 23/12* (2006.01)
*H01L 23/06* (2006.01)
*H01L 23/29* (2006.01)

(52) U.S. Cl. .................. 257/700; 257/703; 257/790; 257/791

(58) Field of Classification Search ................. 257/687, 257/690, 700, 703, 790–794
See application file for complete search history.

(56) References Cited

U.S. PATENT DOCUMENTS 7,245,884 B2 * 7/2007 Oida et al. ................. 455/90.3

2002/0020916 A1   2/2002 Ito
2003/0133274 A1 * 7/2003 Chen et al. ................... 361/760
2004/0029701 A1 * 2/2004 Chikagawa et al. ........... 501/32

FOREIGN PATENT DOCUMENTS

| JP | 63-114240 A | 5/1988 |
|---|---|---|
| JP | 10-335823 A | 12/1998 |
| JP | 11-150202 A | 6/1999 |
| JP | 2000-077942 A | 3/2000 |
| JP | 2001-118868 A | 4/2001 |
| JP | 2002-26187 A | 1/2002 |
| JP | 2002-050652 A | 2/2002 |
| JP | 2002-246507 A | 8/2002 |

(Continued)

OTHER PUBLICATIONS

International Search Report issued in the corresponding International Application No. PCT/JP2005/000052, mailed on Apr. 26, 2005.

(Continued)

*Primary Examiner*—Shouxiang Hu
(74) *Attorney, Agent, or Firm*—Keating & Bennett, LLP

(57) ABSTRACT

A module with a built-in component is produced by disposing a cavity on a mounting surface side of a ceramic multilayer substrate, storing a circuit component therein and, thereafter, performing resin molding. A second resin portion is disposed on the mounting surface side of the ceramic multilayer substrate so as to continuously cover a frame-shaped portion and a first resin portion molded. External terminal electrodes are disposed on an outer surface of the second resin portion.

6 Claims, 5 Drawing Sheets

FOREIGN PATENT DOCUMENTS

| | | |
|---|---|---|
| JP | 2002-344283 A | 11/2002 |
| JP | 2003-7896 A | 1/2003 |
| JP | 2003-124435 A | 4/2003 |
| JP | 2004-259714 A | 9/2004 |
| JP | 2004-319807 A | 11/2004 |
| JP | 2004-319848 A | 11/2004 |

OTHER PUBLICATIONS

Official communication issued in counterpart Chinese Application No. 2005800019083, mailed on Feb. 1, 2008.

Official communication issued in counterpart Chinese Application No. 2005800019083, mailed on Aug. 15, 2008.

Official communication issued in counterpart Japanese Application No. 2005-517630, mailed on Apr. 21, 2009.

* cited by examiner

MODULE WITH BUILT-IN COMPONENT

BACKGROUND OF THE INVENTION

1. Field of the Invention

The present invention relates to a module with a built-in component, wherein a cavity is disposed on the bottom surface side of a ceramic multilayer substrate, a circuit component is stored therein and, thereafter, resin molding is performed, and the present invention also relates to a method for manufacturing such a module.

2. Description of the Related Art

Various high-frequency modules, e.g., chip antennas, delay lines, high-frequency combination switch modules, and receiving devices, are incorporated in information communication apparatuses, e.g., portable terminals. These high-frequency modules are used while being mounted on mounting substrates, e.g., printed wiring boards. In structures of these high-frequency modules, circuit elements are mounted on multilayer substrates.

In recent years, electronic apparatuses, e.g., information communication apparatuses, have been miniaturized, and demands for miniaturization of high-frequency modules have also become intensified. However, if the area of a multilayer substrate is decreased, a problem occurs in that all of the circuit elements required for the module cannot be incorporated.

Consequently, in many cases, a cavity is disposed in a ceramic multilayer substrate, and a circuit component is incorporated in the inside of the cavity.

Japanese Unexamined Patent Application Publication No. 2000-77942 (Patent Document 1) discloses a surface-mount quartz oscillator in which a quartz resonator is incorporated on a ceramic multilayer substrate and, in addition, a cavity is disposed in the bottom surface of the ceramic multilayer substrate, an IC chip is stored in the cavity, and resin molding is performed.

Where a cavity is disposed in a bottom surface (mounting surface) of a ceramic multilayer substrate, as described above, external terminal electrodes are provided on a frame-shaped portion surrounding the cavity of the mounting surface of the ceramic multilayer substrate.

FIG. 9A is a diagram of such a ceramic multilayer substrate, viewed from a back surface direction. In the structure, a cavity 51 is disposed in a bottom surface of the ceramic multilayer substrate 50, and a mold resin 52 is molded to the cavity 51. External terminal electrodes 54 are disposed on a frame-shaped portion 53 surrounding the cavity 51.

However, as the miniaturization of the ceramic multilayer substrate advances, the width of the frame-shaped portion 53 must be decreased, as shown in FIG. 9B. This is because the number and the size of circuit components cannot be changed from the viewpoint of the circuit design and, therefore, the area of the cavity 51 cannot be decreased. Consequently, the area of the external terminal electrodes 54 cannot be adequately provided, and poor connections tend to occur when the incorporation on a mounting substrate, e.g., a motherboard, is performed. Even when the connection is performed normally, since the connection area is small, the connection portion tends to be peeled due to an impact from the outside and connection reliability problems occur.

On the other hand, it is also considered that the external terminal electrodes 54 are disposed on the mold resin 52 filled in the cavity 51. However, since the mold resin 52 is disposed by pouring a liquid resin and, thereafter, curing the resin, the surface may have a concave shape due to curing shrinkage, or the resin may swell upward. Therefore, it is difficult to form a flat surface. Consequently, the surface is not suitable for the formation of the external terminal electrodes 54.

SUMMARY OF THE INVENTION

To overcome the problems described above, preferred embodiments of the present invention provide a module with a built-in component, wherein a cavity is disposed on a molding surface side of a ceramic multilayer substrate, a circuit component is stored therein and, thereafter, resin molding is performed, in particular, a small module with a built-in component, capable of stably forming external terminal electrodes having an adequate area and exhibiting excellent mountability, and a method for manufacturing the module.

A first preferred embodiment of the present invention provides a module with a built-in component including a ceramic multilayer substrate including a laminate of a plurality of ceramic layers and having first and second opposed main surfaces, wherein a cavity and a frame-shaped portion surrounding the cavity are disposed on the first main surface, a first circuit component stored in and fixed to the inside of the cavity, a first resin portion molded to the cavity so as to embed the first circuit component, and a second resin portion, disposed on the frame-shaped portion and the first resin portion so as to continuously cover the frame-shaped portion and the first resin portion defining the first main surface of the ceramic multilayer substrate, and which has external terminal electrodes on a main surface exposed to the outside.

A second preferred embodiment of the present invention provides a method for manufacturing a module with a built-in component including the steps of preparing a ceramic multilayer substrate including a laminate of a plurality of ceramic layers and having first and second opposed main surfaces, wherein a cavity and a frame-shaped portion surrounding the cavity are disposed on the first main surface, storing and fixing a first circuit component in the cavity, forming a first resin portion by filling a liquid thermosetting resin into the cavity so as to embed the first circuit component, forming a second resin portion by pressure-bonding a resin sheet composed of a thermosetting resin in a semicured state so as to continuously cover the frame-shaped portion and the first resin portion defining the first main surface of the ceramic multilayer substrate, and disposing external terminal electrodes on a main surface of the above-described second resin portion, the main surface being exposed to the outside.

In preferred embodiments of the present invention, after the first resin portion is molded to the cavity disposed in the first main surface of the ceramic multilayer substrate, the second resin portion covering the cavity and the frame-shaped portion is formed, and the external terminal electrodes are formed on the surface thereof. Even when concave portions or convex portions are present on the surface of the first resin portion having been molded to the cavity, the second resin portion compensates for the concave and convex portions, and flattens the surface. Therefore, the second resin portion is suitable for the formation of the external terminal electrodes. Consequently, the external terminal electrodes can be formed regardless of the size of the cavity, and the external terminal electrodes having a sufficient area can be formed.

When the resin is molded to the cavity disposed in the bottom surface of the ceramic multilayer substrate, the control of the amount of resin is very difficult, and defects tend to occur in many cases. That is, if a shortage of resin occurs, combined with the curing shrinkage of the resin, the surface of the resin has a concave shape. Conversely, if the amount of resin is too large, the resin swells up to a level higher than the frame-shaped portion. Since the second resin portion compensates for the above-described concave shape and the swelled up portion, the control of the amount of resin poured into the cavity is not as critical and the production yield is improved.

In the case where the ceramic multilayer substrate is formed from a low temperature co-fired ceramic multilayer substrate (LTCC), the strength is less than that of a high temperature co-fired ceramic multilayer substrate (HTCC) in many cases, fracturing or cracking may occur due to an impact with the mounting substrate. However, since the second resin layer is disposed on the mounting surface side of the ceramic multilayer substrate and this second resin layer also serves as an impact absorption layer, the connection reliability against an impact is improved.

Circuit components may be active elements, e.g., transistors, ICs, and LSIs, or passive elements, e.g., chip capacitors, chip resistances, chip thermistors, and chip inductors.

In order to connect the circuit component to the ceramic multilayer substrate, it is preferable to dispose a land electrode on the bottom of the cavity of the ceramic multilayer substrate, and mount the circuit component on the land electrode. For the mounting method, the circuit component may be fixed to the bottom of the cavity and, thereafter, the circuit component may be electrically connected to the land electrode by wire bonding or other suitable method, the electrode of the circuit component may be mounted directly on the land electrode with solder or an electrically conductive adhesive, or flip chip mounting may be conducted. Any suitable mounting method may be used.

It is preferable to dispose at least a portion of the external terminal electrode in a region facing the cavity.

Previously, the formation site of the external terminal electrode has been limited to the frame-shaped portion of the ceramic multilayer substrate. However, in preferred embodiments of the present invention, the external terminal electrode is disposed on the surface of the second resin portion. Therefore, the extension of a portion of the external terminal electrode over the region facing the cavity does not cause any problems, and an external terminal electrode having an increased area may be formed.

According to the second preferred embodiment, an entire external terminal electrode may also be disposed in the region facing the cavity. That is, an external terminal electrode can be disposed in a region where previously an electrode could not be disposed.

In a third preferred embodiment, internal circuit elements are disposed in the inside of the ceramic multilayer substrate, relay electrodes electrically connected to internal circuit elements are disposed at the interface between the frame-shaped portion and the second resin portion, and via conductors electrically connecting the relay electrodes and the external terminal electrodes are disposed in the inside of the second resin portion.

The internal circuit element is a generic name for an internal conductor disposed between layers of the ceramic multilayer substrate and a via conductor penetrating the ceramic multilayer substrate in the thickness direction.

For the method for electrically connecting the external terminal electrode and the internal circuit element disposed in the inside of the ceramic multilayer substrate, the connection can be conducted simply and reliably by forming the relay electrode electrically connected to the internal circuit element at the interface between the frame-shaped portion and the second resin portion, and forming the via conductor electrically connecting the relay electrode and the external terminal electrode in the inside of the second resin portion. Since no electrode is disposed on the perimeter surfaces of the ceramic multilayer substrate and the second resin layer, a method in which the first resin layer is molded to and the second resin layer is joined to the ceramic multilayer substrate in the state of being a mother substrate and, thereafter, division into individual pieces is conducted by cutting or breaking may be adopted. Therefore, a method having excellent mass productivity is provided.

In a fourth preferred embodiment, internal circuit elements are disposed in the inside of the ceramic multilayer substrate, land electrodes electrically connected to the internal circuit elements are disposed on the second main surface of the ceramic multilayer substrate, and second circuit components are mounted on the land electrodes.

When the circuit components are incorporated not only on the first main surface (lower surface) side of the ceramic multilayer substrate, but also on the second main surface (upper surface), as described above, integration is achieved and a higher-performance module with a built-in component is provided.

In another preferred embodiment, a case covering the second circuit components is provided on the second main surface of the ceramic multilayer substrate.

When the circuit components are mounted on the second main surface of the ceramic multilayer substrate, the circuit components are exposed. Therefore, the circuit components tend to fall off when subjected to an external force, and mounting with a mounter cannot be performed.

Consequently, the case covering the circuit components is provided on the ceramic multilayer substrate and, thereby, the circuit components are prevented from falling off and mounting with the mounter is possible. In addition, when a metal case is used, electromagnetic shielding of the circuit components is provided.

In another preferred embodiment, a third resin portion is disposed on the second main surface of the ceramic multilayer substrate, the third resin portion being molded in so as to embed the second circuit components.

In this preferred embodiment, the circuit components are protected by the mold resin and, in addition, mounting with the mounter is possible.

In another preferred embodiment, the second resin portion is formed by pressure-bonding the resin sheet composed of the thermosetting resin in the semicured state so as to continuously cover the frame-shaped portion and the first resin portion defining the first main surface of the ceramic multilayer substrate. The semicured state refers to a B stage state or a prepreg state.

Since the second resin portion is not cured during the pressure bonding, the concave and the convex shape of the first resin portion are compensated for, and the outer surface thereof is flattened. Although the external terminal electrodes are formed on the outer surface of the second resin layer, the formation thereof may be performed after the second resin layer is cured, or the formation may be performed simultaneously with the pressure bonding. For example, it is possible to transfer the external terminal electrodes to the second resin portion by preparing a support plate provided with external terminal electrodes, e.g., copper foil, affixed thereto, pressure-bonding the support plate to the first main surface of the ceramic multilayer substrate with the second resin portion in the semicured state therebetween, and peeling off the support plate after the second resin portion is cured.

With respect to the order of curing of the first resin portion and the second resin portion, the first resin portion may be cured as a first step, the second resin portion may be pressure-bonded and, thereafter, the second resin portion may be cured.

Alternatively, the second resin portion may be pressure-bonded while the first resin portion is in an uncured state and, thereafter, the first resin portion and the second resin portion may be cured simultaneously.

In the former case, since the second resin portion is pressure-bonded after the first resin portion is cured, the concave and convex portions of the first resin portion are easily compensated for by the second resin portion. On the other hand, in the latter case, there is an advantage that a curing step is performed only once.

According to the first preferred embodiment of the invention, after the first resin portion is molded to the cavity disposed in the ceramic multilayer substrate, the second resin portion covering the first resin portion and the frame-shaped portion is disposed, and the external terminal electrodes are formed on the surface thereof. Therefore, even when concave portions or convex portions are present on the surface of the first resin portion, the second resin portion compensates for the concave and convex portions, and the surface is flattened. Consequently, the external terminal electrode can be formed regardless of the size of the cavity, and the external terminal electrode having a required size can be formed.

When the resin is molded to the cavity disposed in the ceramic multilayer substrate, the control of the amount of the resin is very difficult, and defects occur in many cases. However, since the second resin portion compensates for the concave and convex portions of the first resin portion, the control of the amount of resin poured into the cavity is easier and the production yield is improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The preferred embodiments of the present invention will be described below with reference to the drawings.

Figure 1:
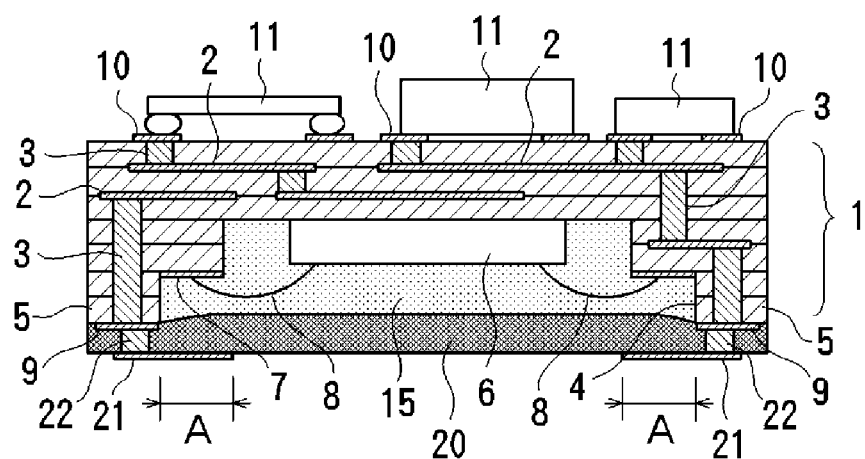
FIG. 1 is a sectional view of a module with a built-in component according to a first preferred embodiment of the present invention.
Figure 2:
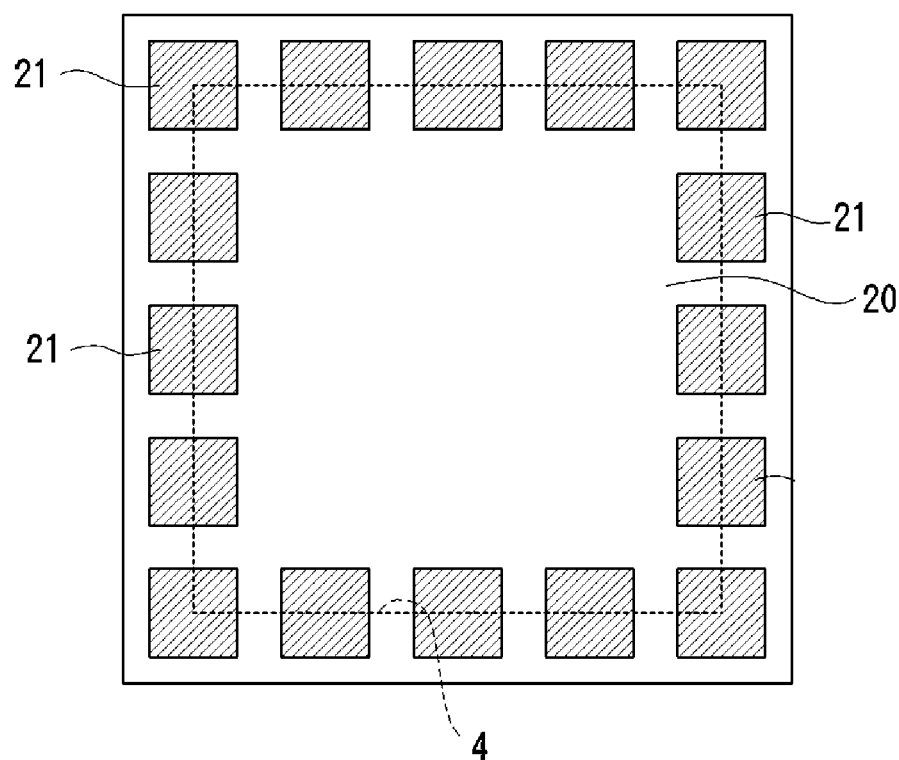
FIG. 2 is a bottom view of the module with a built-in component shown in FIG. 1.

FIG. 1 and FIG. 2 show a module with a built-in component according to the first preferred embodiment of the present invention.

This module with a built-in component preferably includes a ceramic multilayer substrate 1 having a plurality of ceramic layers, a first resin portion 15 molded to a cavity disposed in the lower surface of the ceramic multilayer substrate 1, and a second resin portion 20 disposed over substantially the entire lower surface of the ceramic multilayer substrate 1.

The ceramic multilayer substrate 1 is formed from, for example, a low temperature co-fired ceramic multilayer substrate (LTCC), wherein internal electrodes 2 are disposed between the layers of a plurality of ceramic layers, via conductors 3 are disposed and penetrate the ceramic layers in a thickness direction, and these have been integrally fired. Monolithic capacitors, monolithic inductors, and other suitable components can also be formed integrally in the ceramic multilayer substrate 1. A cavity 4 and a frame-shaped portion 5 surrounding the cavity 4 are disposed in the lower surface of the ceramic multilayer substrate 1. A first circuit component 6 is fixed to the bottom portion of the cavity 4, and this circuit component is electrically connected with bonding wires 8 to electrodes 7 disposed on variable height portions inside the cavity 4.

The first resin portion 15 preferably made of a thermosetting resin is molded in the cavity 4. In the present preferred embodiment, the surface of the first resin portion 10 is concave as compared to the surface of the frame-shaped portion 5.

A plurality of relay electrodes 9 are disposed on the lower surface of the frame-shaped portion 5, and the relay electrodes 9 are electrically connected to the internal electrodes 2 through the via conductors 3.

A plurality of land electrodes 10 are disposed on the upper surface of the ceramic multilayer substrate 1, and the land electrodes are also electrically connected to the internal electrodes 2 through the via conductors 3. Second circuit components 11 are mounted on the land electrodes 10.

The second resin portion 20 is joined to the lower surface of the ceramic multilayer substrate 1 so as to continuously cover the frame-shaped portion 5 and the first resin portion 15. It is desirable that a thermosetting resin having a composition similar to the composition of the first resin portion 15 is used as the second resin portion 20. The same thermosetting resin is preferably used in this preferred embodiment. In particular, when the resin portions 15 and 20 are composed of resins having the same composition, the adhesion between the two resin portions 15 and 20 is outstanding, and peeling of the two resin portions 15 and 20, entry of water into the interface, and the like are prevented. The second resin portion 20 is fills the concave portion of the first resin portion 15, and the outer surface of the second resin portion 20 is formed to be substantially flat. A plurality of external terminal electrodes 21 are disposed on the flat outer surface of the second resin portion 20. As shown in the drawing, a portion of the external terminal electrode 21 is formed so as to extend over the region facing the cavity 4 by a dimension of A. That is, the electrode extends from the frame-shaped portion 5 into the inside. Consequently, even when the width dimension of the frame-shaped portion 5 is small, an external terminal electrode 21 having a sufficient size can be formed. Each external terminal electrode 21 is electrically connected to the relay electrode 9 through the via conductor 22 disposed in a thickness direction in the second resin portion 20.

An active element, e.g., an IC or an LSI, or a passive element, e.g., a chip capacitor, a chip resistance, a chip thermistor, a chip inductor, or a filter, may be used as the circuit component 6 fixed in the cavity 4 and the circuit component 11 mounted on the upper surface of the ceramic multilayer substrate 1. The method for mounting the circuit component 6 is not limited to a connection method using the wire bonding. The mounting may be performed using solder or an electrically conductive adhesive, or flip chip mounting using bumps. Likewise, the method for mounting the circuit component 11 is not limited to mounting using solder or an electrically conductive adhesive. Connection using the wire bonding may be conducted, or flip chip mounting using bumps may be performed.

The second resin portion 20 is prepared by appropriately mixing an inorganic filler into a thermosetting resin, and is pressure-bonded to the lower surface of the frame-shaped portion 5 and the lower surface of the first resin portion 15 while being in a semicured state, followed by curing. An electrically conductive resin filled in a through hole disposed in the resin portion 20, followed by curing, is used as the via conductor 22 disposed in the second resin portion 20. As described above, the external terminal electrodes 21 are disposed on the lower surface of the resin portion 20, and the present module with a built-in component can be mounted on a printed circuit board by connecting the external terminal electrodes 21 to the printed circuit board. The resin portion 20 functions as an impact absorption layer to protect the ceramic multilayer substrate 1 against a drop impact and a thermal shock.

Figure 3:
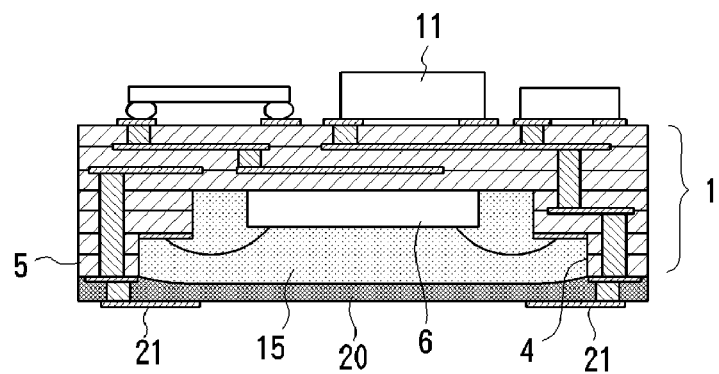
FIG. 3 is a sectional view of a module with a built-in component according to a second preferred embodiment of the present invention.

FIG. 3 shows a module with a built-in component according to the second preferred embodiment of the present invention.

The module with a built-in component shown in FIG. 1 is an example in which the surface of the first resin portion 15 has a concave shape due to curing shrinkage, whereas the surface may swell upward depending on the amount of the resin filled in the cavity 4. FIG. 3 shows the case in which the first resin portion 15 has been cured and which swells up with respect to the surface of the frame-shaped portion 5.

In this case, the second resin portion 20 compensates for the concave and convex portions of the first resin portion 15, and the outer surface of the second resin portion is substantially flat. A plurality of external terminal electrodes 21 are disposed on a flat outer surface of the second resin portion 20.

As described above, even when the surface of the first resin portion 15 has a concave shape or a convex shape depending on the amount of the resin filled in the cavity 4, the second resin portion 20 compensates for the concave and convex portions and, thereby, the surface of the second resin portion 20 is flattened. Consequently, the external terminal electrode 21 having an arbitrary size can be easily formed.

Figure 4:
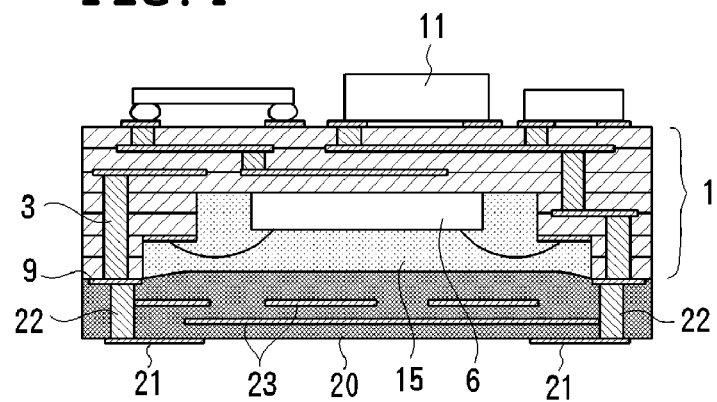
FIG. 4 is a sectional view of a module with a built-in component according to a third preferred embodiment of the present invention.

FIG. 4 shows a module with a built-in component according to the third preferred embodiment.

In the present preferred embodiment, the second resin portion 20 preferably includes a multilayer resin substrate, internal electrodes 23 are disposed between the layers and, thereby, elements, e.g., monolithic capacitors and monolithic inductors, are integrally incorporated inside the module. In particular, when the internal electrode defines a ground electrode, the use of a shield of the circuit component 6 in the cavity is of great value.

Individual elements, e.g., SMD, may be embedded in place of the internal electrodes 23.

In this manner, a higher-performance, smaller module with a built-in component is obtained by integrally incorporating elements or embedding individual elements.

Figure 5:
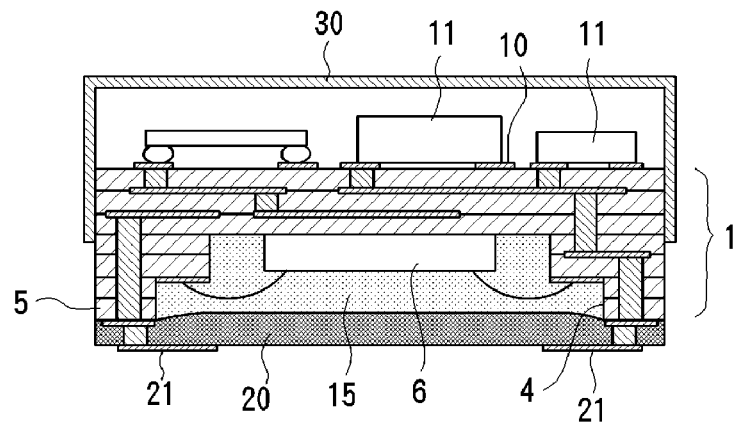
FIG. 5 is a sectional view of a module with a built-in component according to a fourth preferred embodiment of the present invention.

FIG. 5 shows a module with a built-in component according to the fourth preferred embodiment.

In the module with a built-in component shown in FIG. 1, since circuit elements 11 mounted on the surface (upper surface) of the ceramic multilayer substrate are exposed, the circuit elements 11 may fall off, and mounting using a mounter cannot be performed. Consequently, as shown in FIG. 5, a case 30 covering the circuit elements 11 is placed on the surface of the ceramic multilayer substrate 1. A resin case or a metal case may be used as the case 30. When the metal case 30 is used, nickel silver, phosphor bronze, or other suitable materials are preferable from the viewpoint of workability and cost.

Figure 6:
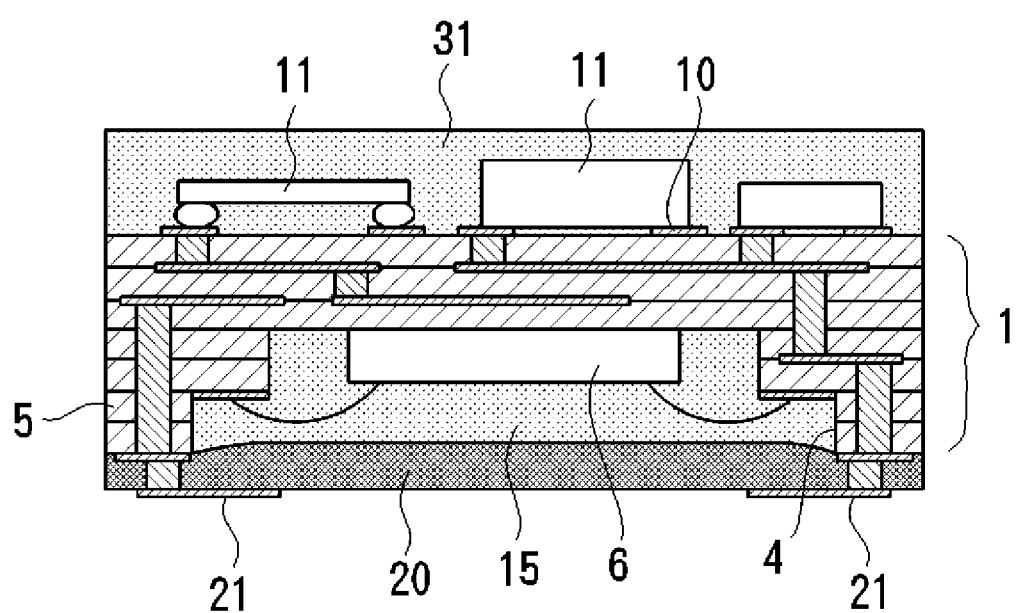
FIG. 6 is a sectional view of a module with a built-in component according to a fifth preferred embodiment of the present invention.

FIG. 6 shows a module with a built-in component according to the fifth preferred embodiment.

In the present preferred embodiment, a resin 31 is molded on the surface of the ceramic multilayer substrate 1 so as to cover the circuit components 11.

When the resin 31 is molded on the surface of the ceramic multilayer substrate 1, if the thermal expansion coefficient of the resin layer 31 on the surface side of the ceramic multilayer substrate 1 and that of the resin layers 15 and 20 on the back side are different, the ceramic multilayer substrate 1 may be warped or become cracked due to different amounts of thermal expansion. Therefore, it is preferable for the resin layers 15, 20, and 31 to be made of the same composition, or materials having similar thermal expansion coefficients.

EXAMPLE 1

An example of methods for manufacturing the module with a built-in component shown in FIG. 1 will be described below with reference to FIGS. 7A-7D.

The ceramic multilayer substrate 1 is prepared. The ceramic multilayer substrate 1 is produced as described below.

A ceramic slurry is applied to a resin film of PET or other suitable material, and is dried, such that a ceramic green sheet having a thickness of about 10 μm to about 200 μm is produced. For example, a mixture of $BaO$, $SiO_2$, $Al_2O_3$, $B_2O_3$, $CaO$, or other suitable mixture may be used as a ceramic powder to be used in the ceramic slurry.

A through hole (via hole) having a diameter of about 0.1 mm is formed in the above-described green sheet with a mold, a laser, or other suitable methods. An electrically conductive paste prepared by kneading a metal powder primarily containing Ag or Cu, a resin, and an organic solvent is filled in the via hole, and is dried. This serves as a via conductor 3.

A desired pattern of electrically conductive paste as in the above description is printed on the green sheet by screen printing or other suitable method, and is dried. This defines the internal electrode 2.

An appropriate number of green sheets are stacked and pressure-bonded at a pressure of about 100 $kgf/cm^2$ to about 2,000 $kgf/cm^2$ and a temperature of about 40° C. to about 100° C.

The relay electrodes 9 and the land electrodes 10 are formed on the surface and the back of the pressure-bonded laminate using an electrically conductive paste as in the above description.

The laminate is fired in air at about 850° C. when the electrically conductive paste has a Ag base, or in $N_2$ at about 950° C. when the paste has a Cu base. The thickness of the laminate is about 1 mm, for example. After firing is conducted, a film of Ni/Sn, Ni/Au, or other suitable material is formed by plating or other suitable method on the electrodes exposed at the surface and the back, if necessary.

Figure 7A:
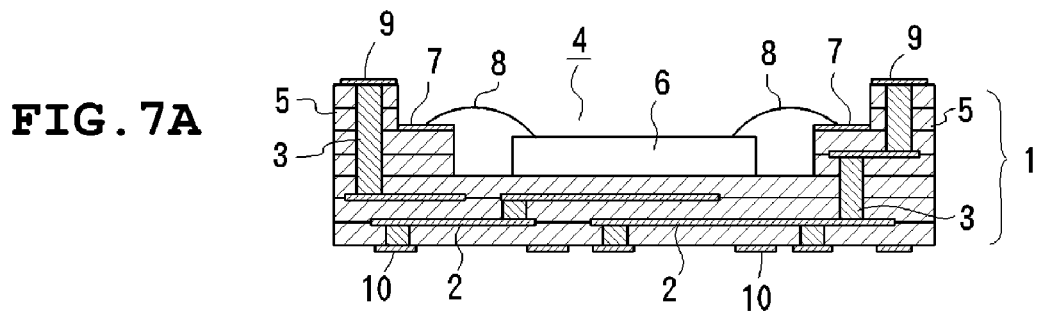
FIGS. 7A-7D are diagrams showing a process for manufacturing the module with a built-in component shown in FIG. 1.

The ceramic multilayer substrate 1 is produced as described above, a circuit component 6 is fixed to the bottom portion of the cavity 4 of the resulting ceramic multilayer substrate 1, and the electrodes 7 are electrically connected to the circuit component 6 by the wire bonding 8, such that the state shown in FIG. 7A results.

Figure 7B:
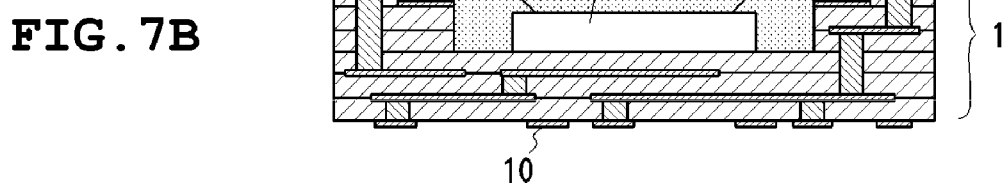

A liquid resin 15 is filled in the cavity 4 of the ceramic multilayer substrate 1, and is cured, such that the first resin portion 15 is formed as shown in FIG. 7B. The liquid resin 15 is composed of a thermosetting resin (epoxy, phenol, cyanate, or other suitable thermosetting resin). The surface of the resin portion 15 in the cured state may have a concave shape.

Figure 7C:
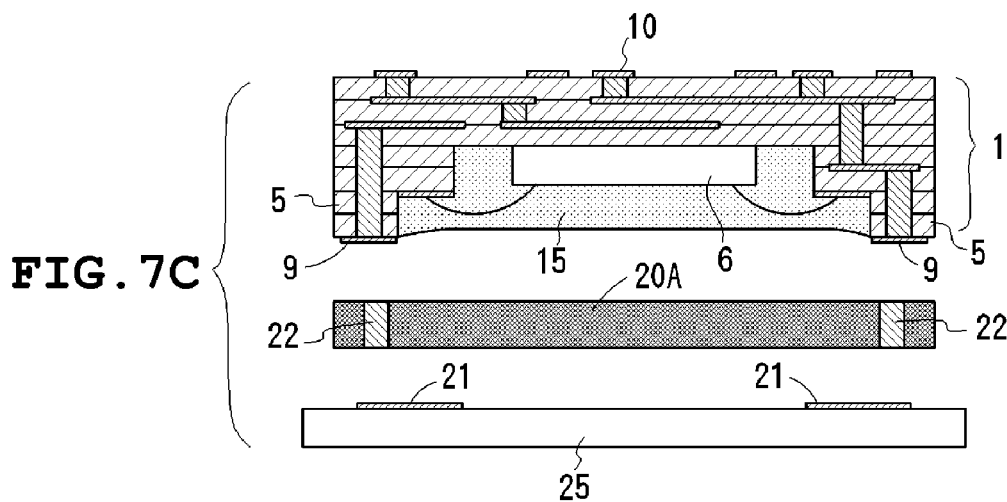

FIG. 7C shows a state in which after the first resin portion 15 is cured, the ceramic multilayer substrate 1 is turned upside down, and a resin sheet 20A in a semicured state and a support 25 are placed thereunder.

The resin sheet 20A is a mixture in which an inorganic filler ($Al_2O_3$, $SiO_2$, $TiO_2$, or other suitable inorganic filler) is mixed into a thermosetting resin (epoxy, phenol, cyanate, or other suitable thermosetting resin), and via holes 22 are bored therein with a laser or other suitable method. The semicured state refers to a B stage state or a prepreg state. An electrically conductive resin (a mixture of metal particles of Au, Ag, Cu, Ni, or other suitable metal particles and a thermosetting resin, e.g., epoxy, phenol, or cyanate) is filled in the via hole 22. In the case where solder is filled in the via hole 22, filling may be conducted by reflow after pressure-bonding to the ceramic multilayer substrate 1.

The support 25 is preferably formed from a metal plate. The upper surface thereof is plated or affixed with copper foil having a thickness of about 10 µm to about 40 µm, and the copper foil is patterned through each of the steps of applying a photoresist, exposing, development etching, and peeling the resist. This defines an external terminal electrode 21.

The resin sheet 20A and the support 25, prepared as described above, are positioned relative to the ceramic multilayer substrate 1, and are subjected to thermocompression bonding.

When the pressure bonding is conducted, the resin sheet 20A in the semicured state is pressure-bonded to the upper surface of the support 25 and, at the same time, is pressure-bonded to the lower surface of the ceramic multilayer substrate 1, that is, the lower surface of the frame-shaped portion 5 provided with the relay electrodes 9 and the surface of the molded first resin portion 15. At this time, a portion of the resin sheet 20A is allowed to fill in the surface of the first resin portion 15 so as to have a concave shape. The resin sheet 20A is heat-cured, while the support 25 is pressure-bonded. When the thermocompression bonding is conducted, the via conductors 22 disposed in the resin sheet 20A are cured and electrically connected to the external terminal electrodes 21 on the support 25 and, at the same time, are also electrically connected to the relay electrodes 9 formed on the lower surface of the frame-shaped portion 5.

Figure 7D:
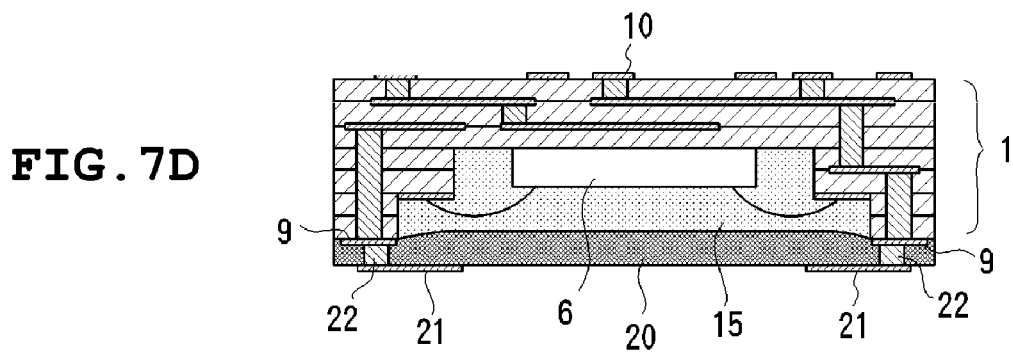

After the thermocompression bonding is conducted, when the support 25 is peeled off, the flat surface of the support 25 is transferred to the second resin portion 20, and the external terminal electrodes 21 affixed to the support 25 are also transferred to the second resin portion 20. As a result, the second resin portion 20 as shown in FIG. 7D is produced.

Subsequently, the circuit components 11 are mounted on the land electrodes 10 of the ceramic multilayer substrate 1 and, thereby, the module with a built-in component shown in FIG. 1 is completed.

With respect to FIGS. 7A-7D, the method for manufacturing a single module with a built-in component is described. However, in order to improve the productivity, the ceramic multilayer substrate 1 and the resin layer 20, as a motherboard, may be laminated and pressure-bonded and, thereafter, individual pieces may be produced by cutting or breaking the motherboard.

With respect to FIGS. 7A-7D, the second resin portion 20 in the semicured state is pressure-bonded to the first resin portion 15 in the cured state. However, the second resin portion 20 in the semicured state may be pressure-bonded to the first resin portion 15 in an uncured state and the two resin portions 15 and 20 may be heat-cured simultaneously.

Furthermore, the above-described cavity has a two-stage structure. However, the cavity may be composed of a single stage or may have at least three stages. Alternatively, a plurality of cavities may be disposed in a side by side arrangement.

FIG. 2 shows an example in which external terminal electrodes 21 are disposed at the peripheral portion of the second resin portion 20. However, as shown in FIG. 8, the external terminal electrodes may be disposed over substantially all of the surface.

Figure 8:
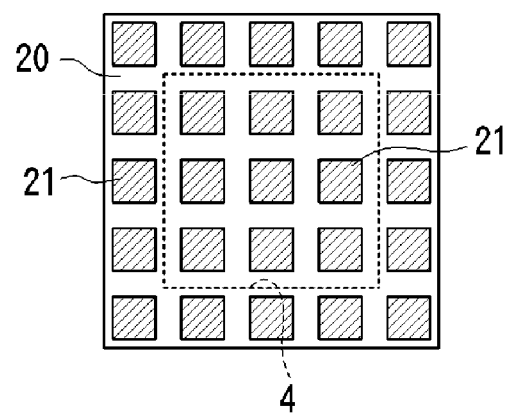
FIG. 8 is a bottom view of a module with a built-in component according to another preferred embodiment of the present invention.
Figure 9A:
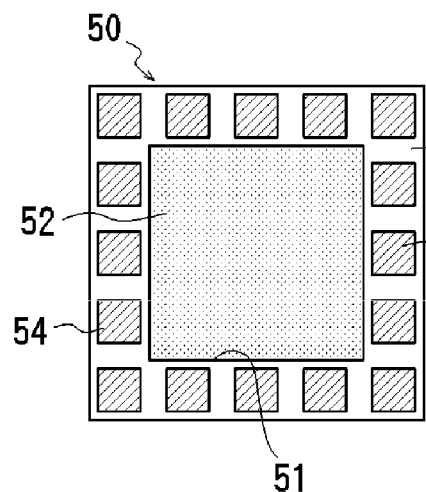
FIGS. 9A and 9B are a bottom views of a known module with a built-in component.
Figure 9B:
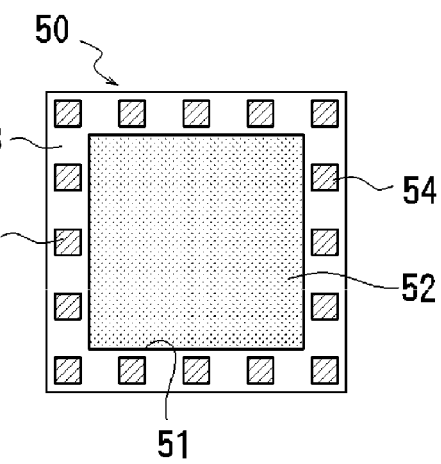

That is, in the case where the second resin portion 20 is composed of a multilayer substrate, the external terminal electrodes 21 can be disposed at arbitrary positions, as shown in FIG. 8, by forming the circuits in the inside thereof or at the interface to the first resin portion 15.

In the above-described case, the surface of the first resin portion has a concave shape or a convex shape. However, the surface may, alternatively, be flat. The surface of the first resin portion 15 can be flattened by controlling the type of resin and the amount of the resin and, furthermore, by conducting hot press, surface polishing, or other suitable method of the first resin portion 15.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A module comprising:
    a ceramic multilayer substrate including a laminate of a plurality of ceramic layers and having first and second main surfaces, wherein a cavity and a frame-shaped portion surrounding the cavity are disposed in the first main surface;
    a first circuit component disposed in and fixed to the inside of the cavity;
    a first resin portion molded in the cavity so as to embed the first circuit component; and
    a second resin portion joined to and in direct contact with a surface of the frame-shaped portion and a surface of the first resin portion such that the second resin portion continuously covers the frame-shaped portion and the first resin portion, and the second resin portion includes external terminal electrodes arranged on a main surface of the second resin portion facing away from the first resin portion and the frame-shaped portion; wherein
    the first resin portion and the second resin portion are separate and distinct elements; and
    the first resin portion resin is not disposed on the frame-shaped portion;
    the surface of the first resin portion is substantially concave;
    the second resin portion fills the substantially concave surface of the first resin portion; and
    the main surface of the second resin portion facing away from the first resin portion is substantially flat.

2. The module according to claim 1, wherein at least a portion of the external terminal electrode is disposed in a region of the module facing the cavity.

3. The module according to claim 1, wherein
internal circuit elements are disposed inside the ceramic multilayer substrate;
relay electrodes electrically connected to the internal circuit elements are disposed at an interface between the frame-shaped portion and the second resin portion; and
via conductors electrically connecting the relay electrodes and the external terminal electrodes are disposed inside the second resin portion.

4. The module according to claim 1, wherein
internal circuit elements are disposed inside the ceramic multilayer substrate;
land electrodes electrically connected to the internal circuit elements are disposed on the second main surface of the ceramic multilayer substrate; and
second circuit components are mounted on the land electrode.

5. The module according to claim 4, wherein a case covering the second circuit components is disposed on the second main surface of the ceramic multilayer substrate.

6. The module according to claim 4, wherein a third resin portion is disposed on the second main surface of the ceramic multilayer substrate, the third resin portion being molded so as to embed the second circuit components.

* * * * *